(12) United States Patent
Haraguchi

(10) Patent No.: US 6,754,865 B2
(45) Date of Patent: Jun. 22, 2004

(54) INTEGRATED CIRCUIT

(75) Inventor: Yoshiyuki Haraguchi, Tokyo (JP)

(73) Assignee: Renesas Technologyy Corp., Tokyo (JP)

( * ) Notice: Subject to any disclaimer, the term of this patent is extended or adjusted under 35 U.S.C. 154(b) by 418 days.

(21) Appl. No.: 09/736,328

(22) Filed: Dec. 15, 2000

(65) Prior Publication Data
US 2002/0004923 A1 Jan. 10, 2002

(30) Foreign Application Priority Data

Jul. 5, 2000 (JP) .......................................... 2000-204033

(51) Int. Cl.$^7$ ............................................... G06F 11/00
(52) U.S. Cl. ..................................... 714/736; 365/201
(58) Field of Search ................................ 714/736, 718; 365/201, 200, 226; 364/739; 324/73 R

(56) References Cited

U.S. PATENT DOCUMENTS

| | | | | |
|---|---|---|---|---|
| 4,598,245 A | * | 7/1986 | Groves et al. ............ 324/73 R |
| 4,870,607 A | * | 9/1989 | Ishizuka ..................... 364/739 |
| 5,040,150 A | * | 8/1991 | Naitoh et al. ................ 365/201 |
| 5,305,267 A | * | 4/1994 | Haraguchi et al. .......... 365/201 |
| 5,446,692 A | * | 8/1995 | Haraguchi et al. .......... 365/200 |
| 5,808,945 A | * | 9/1998 | Arase .......................... 365/200 |
| 6,072,737 A | * | 6/2000 | Morgan et al. .............. 365/201 |
| 6,115,833 A | * | 9/2000 | Sato et al. ................... 714/718 |
| 6,324,666 B1 | * | 11/2001 | Nakamoto ................... 714/736 |

FOREIGN PATENT DOCUMENTS

| | | | | |
|---|---|---|---|---|
| JP | 05182472 A | * | 7/1993 | ................. 365/226 |
| JP | 9-231794 | | 9/1997 | |
| JP | 11-016393 | | 1/1999 | |

* cited by examiner

Primary Examiner—Albert Decady
Assistant Examiner—Dipakkumar Gandhi
(74) Attorney, Agent, or Firm—Burns, Doane, Swecker & Mathis, L.L.P.

(57) ABSTRACT

N-bit external data input from the outside is converted to m-bit data (m>n) by simultaneous write circuits and the m-bit data is supplied to a semiconductor memory. When m-bit data is read out of the semiconductor memory, coincidence judgement results are output. Thus, in a memory-logic-combined integrated circuit, the semiconductor memory can be efficiently tested without a lot of external data input/output terminals.

9 Claims, 14 Drawing Sheets

INTEGRATED CIRCUIT

BACKGROUND OF THE INVENTION

1. Field of the Invention

The present invention relates to an integrated circuit with a semiconductor memory and a logic circuit. More particularly, the present invention relates to an improvement enabling efficient tests of the semiconductor memory even if a bus width of an internal data bus between the semiconductor memory and the logic circuit is wider than that of an external data bus between the logic circuit and data input/output terminals.

2. Description of Related Art

FIG. 14 is a block diagram showing a conventional integrated circuit. In the figure, the reference numeral 53 designates an integrated circuit formed on a semiconductor substrate; 54 designates a semiconductor memory formed as a part of the integrated circuit 53; 55 designates a logic circuit formed on the same semiconductor substrate as the semiconductor memory 54; 56 designates internal signal lines connected between the semiconductor memory 54 and the logic circuit 55; 57 designates an external input/output terminal; and 58 designates external signal lines connected between the logic circuit 55 and a plurality of external input/output terminals.

Next, the operation of the conventional integrated circuit will be described.

When certain signals are sent from the external input/output terminals 57, each signal is transmitted to the logic circuit 55 through the external signal lines 58. Based on this input and the like, if necessary, the logic circuit 55 then accesses the semiconductor memory 54 through the internal signal lines 56.

Since the conventional integrated circuit 53 is thus constructed, signals in the external input/output terminals 57 cannot be directly input to/output from the semiconductor memory 54. Accordingly, in order to perform tests on the semiconductor memory 54 by using the test technique for a single memory (a memory without a logic circuit 55) as described in Patent Kokai HEI9(1997)-231794 and Patent Kokai HEI11(1999)-16393, an input/output selector should be provided for direct connection between the external input/output terminals 57 and the semiconductor memory 54.

However, even if the above technique is used, the bit number of data which can be written to and read out of the semiconductor memory 54 at a time is limited to as few as the number of the external input/output terminals 57 for inputting/outputting data to/from the logic circuit 55. There is thus a problem in that, in such an integrated circuit 53 containing both a logic circuit 55 and a semiconductor memory 54 (hereinafter referred to as "logic-memory-combined integrated circuit"), although the memory capacity has increased due to recent advances in high integration technique, tests of the memory cannot be performed with the efficiency of a single memory with a great number of external data input/output terminals 57.

SUMMARY OF THE INVENTION

The present invention is implemented to solve the above problem involved in such a logic-memory-combined integrated circuit. An object of the present invention is to provide an integrated circuit wherein a semiconductor memory can be efficiently tested corresponding to the degree of its large capacity while suppressing or preventing an increase in number of input/output terminals for use in the test.

According to the present invention, there is provided An integrated circuit comprising; a semiconductor memory for receiving m-bit internal data (m is an integer of 2 or more) in and outputting the data from an internal address; a logic circuit for receiving the m-bit internal data from and outputting the data to the semiconductor memory while designating the internal address; an internal data bus connected between the semiconductor memory and the logic circuit, having m internal data lines, for transmitting the m-bit internal data between the semiconductor memory and the logic circuit; a data input/output terminal group for receiving n-bit external data (n is less than m and an integer of 1 or more) from and outputting the data to outside; an external data bus connected between the logic circuit and the data input/output terminal group, having n external data lines, for transmitting the n-bit external data between the logic circuit and the external data input/output terminal group; at least one simultaneous write circuit, each connected to a plurality of internal data lines and an external data line, for receiving bit data which is at least a part of n-bit data in the external data bus from the external data line, dividing the data into a plurality of bit data of a same value, and outputting the divided data to the internal data lines, thereby the m-bit data being produced from the n-bit data in the external data bus and output to the internal data bus; and at least one coincidence judgement circuit, each connected to same internal data lines and external data line as those which a corresponding simultaneous write circuit is connected to, for effecting coincidence judgement of data in these internal data lines and outputting a coincidence judgement result to the external data line, the number of the coincidence judgement circuit(s) being equal to that of the simultaneous write circuit(s).

Here, a bit number "m" of the internal data may be "L" times a bit number "n" of the external data wherein L is an integer of 2 or more; the simultaneous write circuits and the coincidence judgement circuits may be provided one for every L internal data lines; and each of the coincidence judgement circuits may change a level of an output to be provided to an external data line depending on coincidence/incoincidence.

The semiconductor memory may comprise: a plurality of memory blocks each comprising: a plurality of memory cells arranged in a matrix layout; a plurality of word lines extending along one direction of the layout of the memory cells; a plurality of bit lines extending along another direction of the layout of the memory cells; a sense amplifier connected to an internal data line; and a plurality of selectors each connecting a bit line to the sense amplifier: a line address decoder for applying a selection voltage to one of the word lines: and a row address decoder for applying a selection voltage to one of the selectors.

The integrated circuit may further comprise a switching decoder between the memory blocks and the line address decoder or the row address decoder, connected to word lines or bit lines more than lines which the line address decoder or the row address decoder is connected to, for intercepting a selection voltage for a certain word line or bit line supplied from the line address decoder or the row address decoder and supplying it to a line of the excess word lines or bit lines.

Switching decoders may be provided one for every internal data lines connected to a simultaneous write circuit and a coincidence judgement circuit between the memory blocks and the row address decoder.

Switching decoders may be provided one for every L/j internal data lines (j is an integer of 2 or more) between the row address decoder and the memory blocks: and the integrated circuit further comprises partial judgement means; the means having j partial coincidence judgement circuits, connected one to every L/j of internal data lines connected to a coincidence judgement circuit, for effecting coincidence judgement for the connected L/j internal data lines; the partial judgement means for outputting different signals depending on which partial coincidence judgement circuit judges incoincidence.

The partial judgement means may have a display circuit for receiving outputs from the two partial coincidence judgement circuits and outputting signals of different levels depending on which circuit judges incoincidence.

The partial judgement means may have a serial circuit for switching a plurality of outputs from the partial coincidence judgement circuits in sequence to serially output them to the outside.

The partial judgement means may have an encoder for receiving a plurality of outputs from the partial coincidence judgement circuits, and producing signals of different values depending on which partial coincidence judgement circuit judges incoincidence, a bit number of the signals being less than bits based on the outputs of the partial coincidence judgement circuits.

As stated above, according to an aspect of the present invention, an integrated circuit comprises; a semiconductor memory for receiving m-bit internal data (m is an integer of 2 or more) in and outputting the data from an internal address; a logic circuit for receiving the m-bit internal data from and outputting the data to the semiconductor memory while designating the internal address; an internal data bus connected between the semiconductor memory and the logic circuit, having m internal data lines, for transmitting the m-bit internal data between the semiconductor memory and the logic circuit; a data input/output terminal group for receiving n-bit external data (n is less than m and an integer of 1 or more) from and outputting the data to outside; an external data bus connected between the logic circuit and the data input/output terminal group, having n external data lines, for transmitting the n-bit external data between the logic circuit and the external data input/output terminal group; at least one simultaneous write circuit, each connected to a plurality of internal data lines and an external data line, for receiving bit data which is at least a part of n-bit data in the external data bus from the external data line, dividing the data into a plurality of bit data of a same value, and outputting the divided data to the internal data lines, thereby the m-bit data being produced from the n-bit data in the external data bus and output to the internal data bus; and at least one coincidence judgement circuit, each connected to same internal data lines and external data line as those which a corresponding simultaneous write circuit is connected to, for effecting coincidence judgement of data in these internal data lines and outputting a coincidence judgement result to the external data line, the number of the coincidence judgement circuit(s) being equal to that of the simultaneous write circuit(s). Thus, at the time of tests, the above construction allows the writing into the semiconductor memory by utilizing all the bus width of a wide internal data bus generally used in an integrated circuit, for example, with a semiconductor memory of a large capacity.

Thus, even in such a logic-memory-combined integrated circuit, a semiconductor memory of a large capacity can be efficiently tested for a short period of time corresponding to the degree of its large capacity by suitably using the basic structure of the existing integrated circuit, while suppressing or preventing the increased provision of input/output terminals for use in the tests.

According to an aspect of the present invention, a bit number "m" of the internal data is "L" times a bit number "n" of the external data wherein L is an integer of 2 or more; the simultaneous write circuits and the coincidence judgement circuits are provided one for every L internal data lines; and each of the coincidence judgement circuits changes a level of an output to be provided to an external data line depending on coincidence/incoincidence. Thus, at the time of tests, the number of writing data to and reading data out of the semiconductor memory can be 1/L; and both the advantage of suppressing the increased provision of input/output terminals for use in the tests and the advantage of enhancing the test efficiency can be simultaneously obtained by the maximum utilization of the basic structure of an existing logic-memory-combined integrated circuit.

Semiconductor memories used in such an invention includes a semiconductor memory comprising: a plurality of memory blocks each comprising; plurality of memory cells arranged in a matrix layout; a plurality of word lines extending along one direction of the layout of the memory cells; a plurality of bit lines extending along another direction of the layout of the memory cells; a sense amplifier connected to an internal data line; and a plurality of selectors each connecting a bit line to the sense amplifier: a line address decoder for applying a selection voltage to one of the word lines: and a row address decoder for applying a selection voltage to one of the selectors.

In particular, a switching decoder is provided between the memory blocks and the line address decoder or the row address decoder, connected to word lines or bit lines more than lines which the line address decoder or the row address decoder is connected to, for intercepting a selection voltage for a certain word line or bit line supplied from the line address decoder or the row address decoder and supplying it to a line of the excess word lines or bit lines. Consequently, the line switching decoders or the row switching decoders can prevent access to a memory cell (word line, bit line) which has been found to be defective in a test and allows the use of a redundant word line or bit line which is excessively provided instead of the defective memory cell, efficiently enhancing the yield of an integrated circuit.

According to an aspect of the present invention, since switching decoders are provided one for every internal data lines connected to a simultaneous write circuit and a coincidence judgement circuit between the memory blocks and the row address decoder, test results can be one to one corresponded to the row switching decoders. Thus, only by setting an address where a defect is found by a test in the corresponding row switching decoder such that a bit line containing the address is replaced with a redundant bit line, the defect can be removed and each row switching decoder is not required to calculate for identifying a bit line to be switched based on test results so that tests can be more efficiently performed.

According to an aspect of the present invention, switching decoders are provided one for every L/j internal data lines (j is an integer of 2 or more) between the row address decoder and the memory blocks: and the integrated circuit further comprises partial judgement means; the means having j partial coincidence judgement circuits, connected one to every L/j of internal data lines connected to a coincidence judgement circuit, for effecting coincidence judgement for the connected L/j internal data lines; the partial judgement means for outputting different signals depending on which partial coincidence judgement circuit judges incoincidence. Consequently, in a case where a test result from a data connection terminal shows malfunction, if an output signal from the corresponding partial coincidence judgement unit is confirmed, a row switching decoder connected to a fault bit line can be identified.

Accordingly, the bus width of the internal data bus can be determined regardless of the number of the row switching decoders. Further, although all the internal data lines associated with a plurality of row switching decoders are judged together by the coincidence judgement circuits, a row switching decoder connected to the defective bit line can be simultaneously confirmed. Only the row switching decoder is required to switch the defective bit line. Thus, defects can be removed by the maximum utilization of the basic structure of an existing logic-memory-combined integrated circuit, thereby enhancing its yield.

According to an aspect of the present invention, since the partial judgement means has a display circuit for receiving outputs from the two partial coincidence judgement circuits and outputting signals of different levels depending on which circuit judges incoincidence, the number of input/output terminals required to confirm outputs from partial coincidence judgement circuits from the outside can be reduced by half. Thus, both the advantage of suppressing the increased provision of input/output terminals for use in the tests and the advantage of enhancing the test efficiency can be simultaneously obtained with a higher yield by increasing row switching decoders.

According to an aspect of the present invention, since the partial judgement means has a serial circuit for switching a plurality of outputs from the partial coincidence judgement circuits in sequence to serially output them to the outside, the number of input/output terminals required to confirm outputs of the partial coincidence judgement circuits from the outside can be reduced to the inverse number of its switching number. Thus, both the advantage of suppressing the increased provision of input/output terminals for use in the tests and the advantage of enhancing the test efficiency can be simultaneously obtained with a higher yield by increasing row switching decoders.

According to an aspect of the present invention, since the partial judgement means has an encoder for receiving a plurality of outputs from the partial coincidence judgement circuits, and producing signals of different values depending on which partial coincidence judgement circuit judges incoincidence, a bit number of the signals being less than bits based on the outputs of the partial coincidence judgement circuits, the number of input/output terminals required to confirm outputs of partial coincidence judgement circuits from the outside can be reduced. Thus, both the advantage of suppressing the increased provision of input/output terminals for use in the tests and the advantage of enhancing the test efficiency can be simultaneously obtained with a higher yield by increasing row switching decoders.

Specially, since the display circuit, the serial circuit and the encoder are arranged in this order, even if the capacity of the semiconductor memory in the logic-memory-combined integrated circuit undergoes further increases in the future, the test efficiency can be enhanced, while the number of input/output terminals for use in tests is effectively suppressed.

DETAILED DESCRIPTION OF THE PREFERRED EMBODIMENTS

An embodiment of the invention will be described.

Embodiment 1

Figure 1:
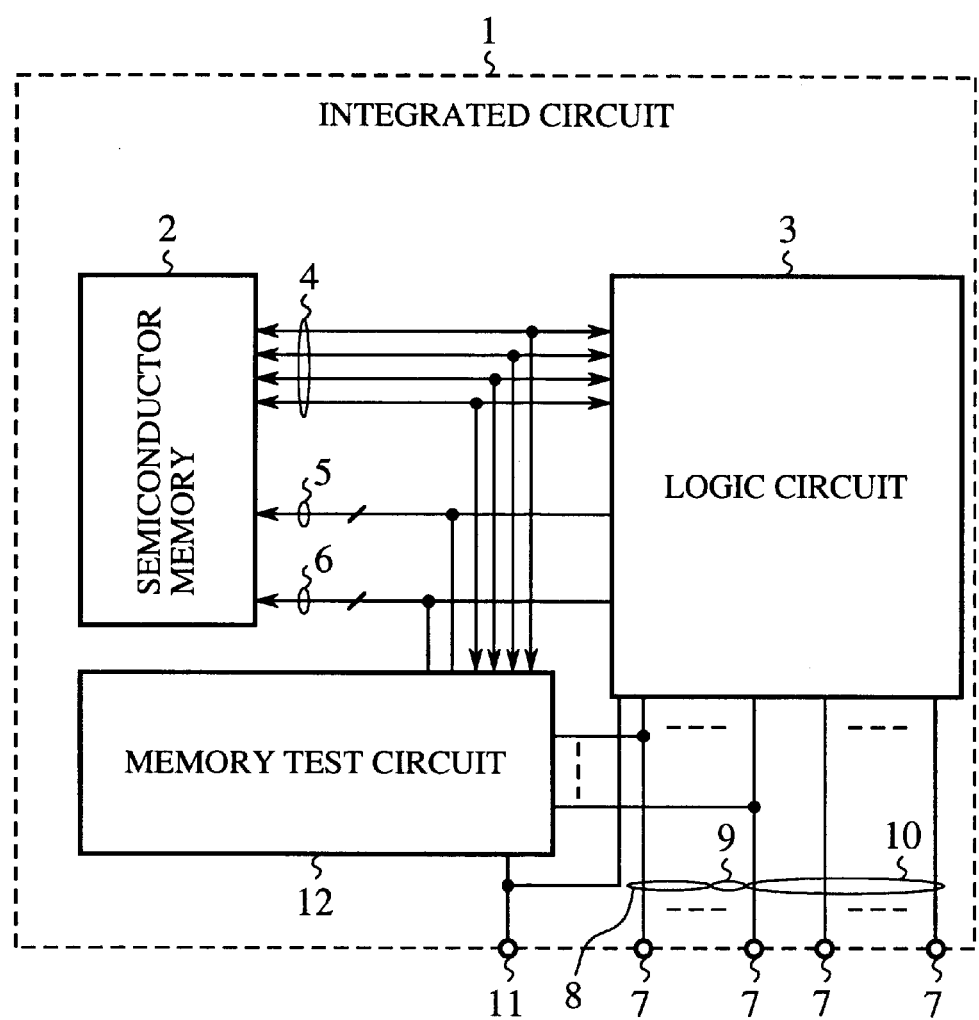
FIG. 1 is a block diagram showing an integrated circuit according to the embodiment 1 of the present invention.

FIG. 1 is a block diagram showing an integrated circuit according to the embodiment 1 of the present invention. In the figure, the reference numeral 1 designates an integrated circuit formed on a single semiconductor substrate; 2 designates a semiconductor memory formed as a part of the integrated circuit 1; 3 designates a logic circuit formed on the same semiconductor substrate as the semiconductor memory 2; 4 designates an internal data bus made of a plurality of internal data lines, connected between the semiconductor memory 2 and the logic circuit 3; 5 designates an internal address bus made of a plurality of internal address lines, connected between the semiconductor memory 2 and the logic circuit 3; 6 designates an internal control line group made of a plurality of internal control lines, connected between the semiconductor memory 2 and the logic circuit 3; 7 designates an external input/output terminal (date input/output terminal group) provided to connect the logic circuit 3 to an external circuit; 8 designates an external data bus made of a plurality of external data lines, connected between the logic circuit 3 and a plurality of external input/output terminals 7; 9 designates an external address bus made of a plurality of external address lines, connected between the logic circuit 3 and the external input/output terminals 7; 10 designates an external control line group made of a plurality of external control lines, connected between the logic circuit 3 and the external input/output terminals 7; 11 designates an external mode control terminal for receiving a mode switching signal for switching a state of the integrated circuit 1 to a test mode or a normal mode; and 12 designates a memory test circuit connected to the internal data bus 4, the internal address bus 5, the internal control line group 6, the external data bus 8, the external address bus 9 and the external control line group 10, the mode switching signal being input to the memory test circuit 12. The mode switching signal is also fed to the logic circuit 3. The logic circuit 3 operates in the normal mode, while it stops access to at least the semiconductor memory 2 in the test mode.

Figure 2:
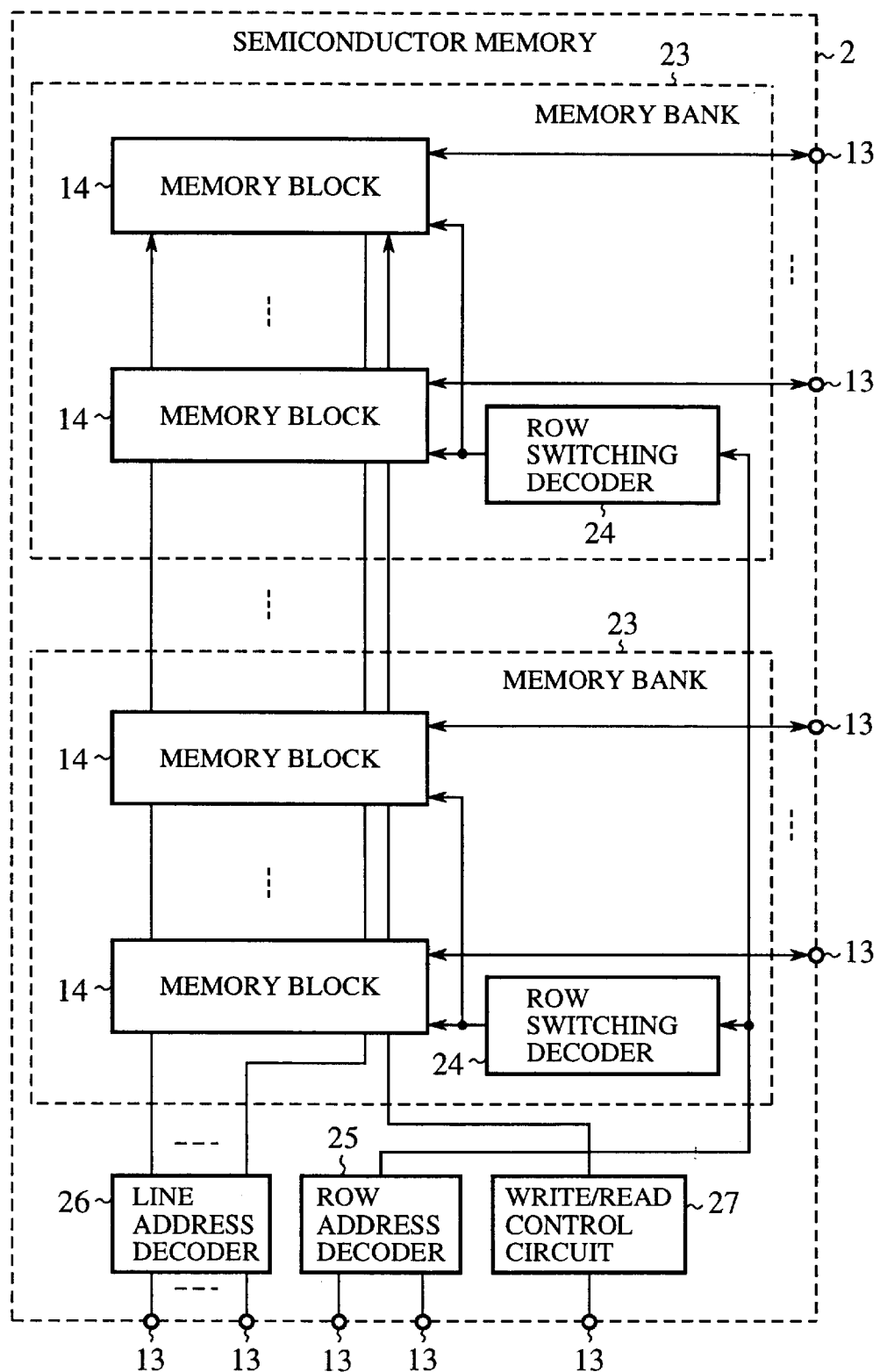
FIG. 2 is a block diagram showing the interior construction of the semiconductor memory according to the embodiment 1 of the present invention.
Figure 3:
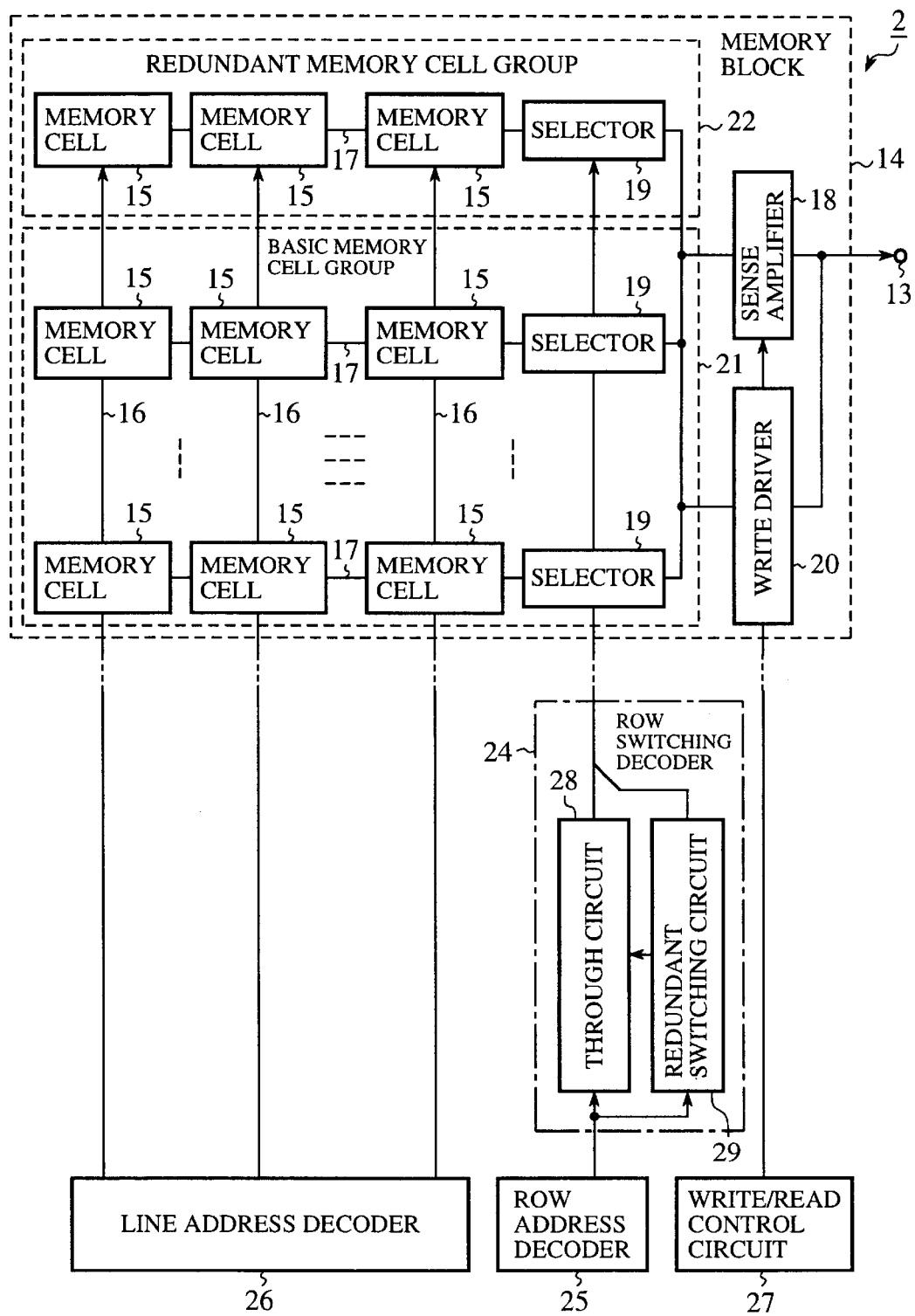
FIG. 3 is a partial detailed block diagram showing the interior construction of a part of the semiconductor memory according to the embodiment 1 of the present invention.

FIG. 2 is a block diagram showing the interior construction of the semiconductor memory 2 according to the embodiment 1 of the present invention. FIG. 3 is a partial detailed block diagram showing the interior construction of a part of the semiconductor memory 2 according to the embodiment 1 of the present invention. In these figures, the reference numeral 13 designates a memory terminal connected to an internal data line, an internal address line or an internal control line; 14 designates a memory block, provided one for each internal data line; 15 designates a memory cell for storing one-bit data, memory cells being arranged in a matrix layout,; 16 designates a word line extending along a direction of the layout of the memory cells 15; 17 designates a bit line extending along the other direction thereof; 18 designates a sense amplifier, provided one in each memory block, and connected to an internal data line; 19 designates a selector for connecting a bit line 17 to a sense amplifier 18, when a bit line selection voltage is supplied, the number of selectors in a memory block 14 being the same as that of bit lines 17 in the memory block 14; 20 designates a write driver, provided one in each memory block 14, for directing write to the sense amplifier; 21 designates a basic memory cell group; and 22 designates a redundant memory cell group.

The reference numeral 23 designates a memory bank made of a plurality of memory blocks 14; 24 designates a row switching decoder (switching decoder), provided one in each memory bank 23, for outputting a bit line selection voltage to a selector selected from the selectors 19 in each memory block 14; 25 designates a row address decoder, connected to a plurality of internal address lines in the internal address bus 5, for outputting a bit line selection voltage to all the row switching decoders 24 based on combinations of the voltages of these internal address lines; 26 designates a line address decoder, connected to the remaining internal address lines in the internal address bus 5, for selectively outputting a word line selection voltage to a line of the word lines 16 in all memory blocks 14 based on combinations of the voltage of these internal address lines; and 27 designates a write/read control circuit, connected to a read/write control signal line (i.e., a line of the internal control line group 6), for supplying a write/read control signal to write drivers 20 of all the memory blocks 14 corresponding to a voltage of the read/write control signal line. In addition, the reference numeral 28 designates a through path for supplying a bit line selection voltage received from the row address decoder 25 as it is to any one of selectors 19; and 29 designates a redundant switching circuit for stopping the through control of bit line selection voltages by the through circuit 28 when a bit line selection voltage for a particular preset bit line 17 is detected and received, and at the same time supplying the bit line selection voltage to the selector 19 connected to the bit line 17 of the redundant memory cell group 22.

Figure 4:
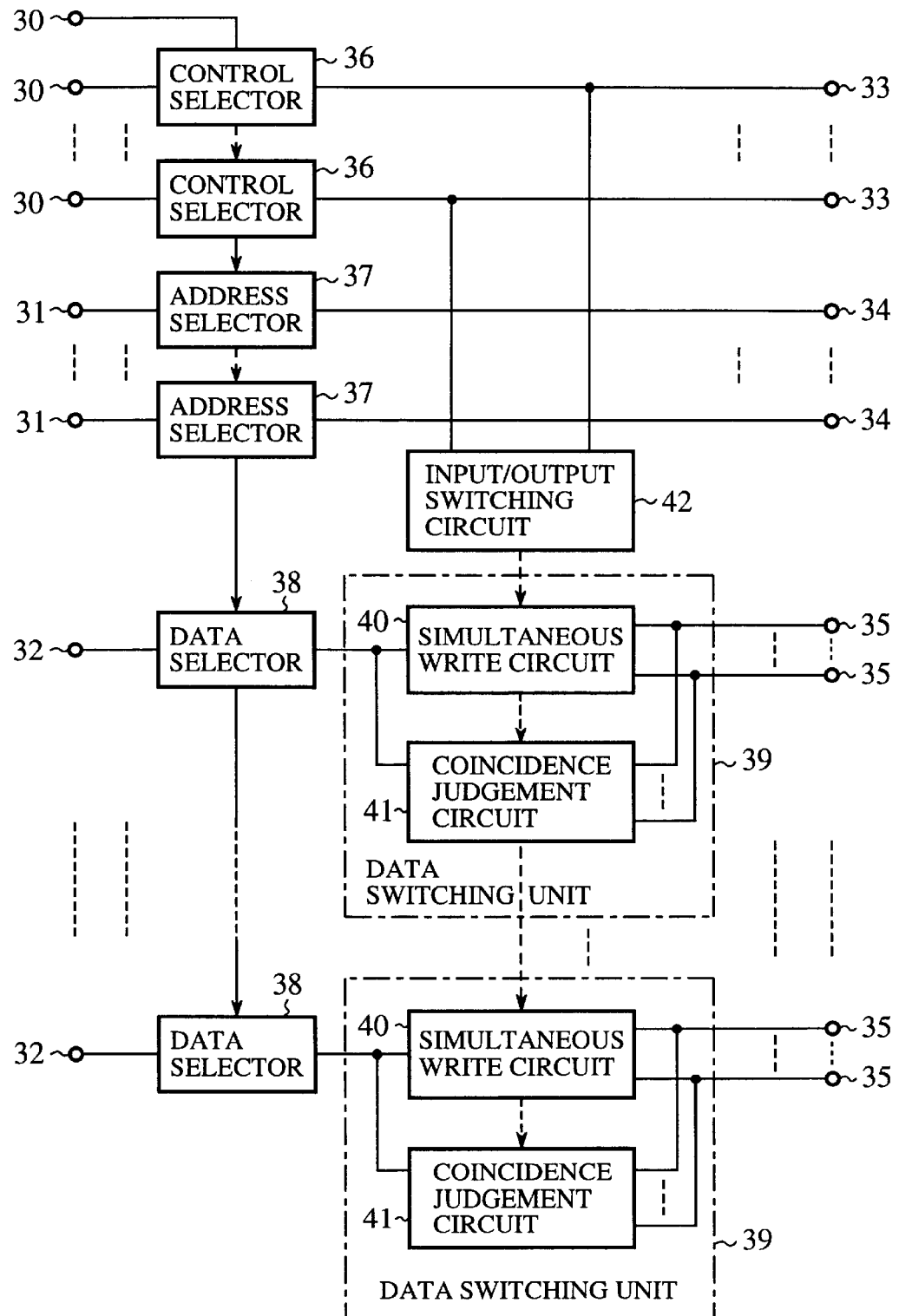
FIG. 4 is a block diagram showing the interior construction of a memory test circuit according to the embodiment 1 of the present invention.

FIG. 4 is a block diagram showing the interior construction of the memory test circuit 12 according to the embodiment 1 of the present invention. In the figure, the reference numeral 30 designates an external control connection terminal connected to an external control line including a signal line for mode switching signals; 31 designates an external address connection terminal connected to an external address line; 32 designates an external data connection terminal connected to an external data line; 33 designates an internal control connection terminal connected to an internal control line; 34 designates an internal address connection terminal connected to an internal address line; 35 designates an internal data connection terminal connected to an internal data line; 36 designates a control selector for connecting an external control connection terminal 30 to an internal control connection terminal 33, when a mode switching signal is the test mode; 37 designates an address selector for connecting an external address connection terminal 31 to an internal address connection terminal 34, when a mode switching signal is the test mode; 38 designates a data selector; and 39 designates a data switching unit. When a mode switching signal is the test mode, data selector 38 and data switching unit 39 connect an external data connection terminal 32 to a plurality of internal data connection terminals 35.

The reference numeral 40 designates a simultaneous write circuit connected to a data selector 38 and a plurality of internal data connection terminals 35 for simultaneously providing the same data as that in the data selector 38 to the internal data connection terminals 35; 41 designates a coincidence judgement circuit, connected to a data selector and a plurality of internal data connection terminals 35 which the corresponding simultaneous write circuit 40 is connected to, for providing a signal of a high level when outputs from the internal data connection terminals 35 coincide with each other, and providing a signal of a low level when at least one of the outputs from the internal data connection terminals 35 does not coincide with the other outputs; and 42 designates an input/output switching circuit for operating the simultaneous write circuits 40 when an output from a control selector 36 directs a write processing, and operating the coincidence judgement circuits 41 when an output from a control selector 36 directs a read processing. According to the embodiment 1, when the bus width (bit number) of the internal data bus 4 is "m" and the bus width (bit number) of the external data bus 8 is "n", n simultaneous write circuits 40 (coincidence judgement circuits 41) are provided and each simultaneous write circuit 40 outputs one bit to L (=m/n>=2) internal data lines. The number of the memory banks 23 is the same as that of the simultaneous write circuits 40 (coincidence judgement circuits 41).

Next, the operation of the integrated circuit will be described.

When the normal mode is set by a mode switching signal supplied from the external mode control terminal 11, the logic circuit 3 starts its operation, while the memory test circuit 12 stops its operation. Thus, each signal input from the external input/output terminals 7 is sent to the logic circuit 3 through the external data bus 8, the external address bus 9 or the external control line group 10. The logic circuit 3 then operates based on this external signal and, if necessary, controls the internal data bus 4, the internal address bus 5 and the internal control line group 6 to access to the semiconductor memory 2. In the semiconductor memory 2, corresponding to an address in the internal address bus 5, the line address decoder 26 activates a certain word line 16, while the row address decoder 25 activates a certain selector 19. In case of a read access, the memory contents of a memory cell 15 selected by the line address decoder 26 and the row address decoder 25 is amplified by a sense amplifier 18 to be output to an internal data line. In case of a write access, data in an internal data line is stored in a memory cell 15 selected by the line address decoder 26 and the row address decoder 25.

Next, when the test mode is set by a mode switching signal supplied from the external mode control terminal 11, the logic circuit 3 stops its operation, while the memory test circuit 12 starts its operation. Specifically, all the control selectors 36, all the address selectors 37 and all the data selectors 38 in the memory test circuit 12 operate to establish connections between the external control connection terminals 30 and the internal control connection terminals 33, between the external address connection terminals 31 and the internal address connection terminals 34, and between the external data connection terminals 32 and the internal data connection terminals 35.

In this state, if the input/output switching circuit 42 operates simultaneous write circuits 40 in response to the setting of an external control connection terminal 30, external data provided from the external input/output terminals 7 is directly input to the semiconductor memory 2 through the memory test circuit 12, and the internal data bus 4 and the like. Specially, each simultaneous write circuit 40 divides one-bit data input from an external data connection terminal 32 into a plurality of bits to output them to a plurality of internal data lines and a plurality of simultaneous write circuits 40 are simultaneously output data to all internal data lines, thus allowing data write for every internal data bus width.

If the input/output switching circuit 42 operates coincidence judgement circuits 41 in response to the setting of an external control connection terminal 30, internal data and the like output from the semiconductor memory 2 is directly output to the outside through the memory test circuit 12, the external data bus 8, the external input/output terminals 7 and the like. Specially, each coincidence judgement circuit 41 judges for coincidence of L internal data lines and transmits the judgement result to an external data connection terminal 32, thus allowing coincidence judgement for every internal data bus width.

A test can be efficiently performed in a few test vectors by effecting write and coincidence judgement read for every internal data bus width. As a result of the test, if a memory cell 15 is judged to have a defect, a redundant switching circuit 29 is set in a memory bank 23 containing the defective memory cell 15 so as to use a normal memory cell 15 of a redundant memory cell group 22 instead of the defective memory cell 15. Thus, if a bit line selection voltage for a selector 19 connected to a bit line 17 with the defective memory cell 15 is supplied from a row address decoder 25, a redundant switching circuit 29 stops the through control of bit line selection voltages by a through path 28, and supplies the bit line selection voltage to the selector 19 connected to the bit line 17 of the redundant memory cell group 22. Consequently, data can be correctly stored and read out by using a correct memory cell 15 of the redundant memory cell group 22.

Assuming that the bit number of internal data is "m", the bit number of external data is "n" and L (=m/n) is an integer of 2 or more, the embodiment 1 has been described. However, the present invention is not limited thereto, they may be any values as far as "n" is at least less than "m" and m-bit data is generated by dividing bit data which is at least a part of n-bit data in the external data bus into a plurality of data of the same value and transmitted to the internal data bus 4.

Figure 5:
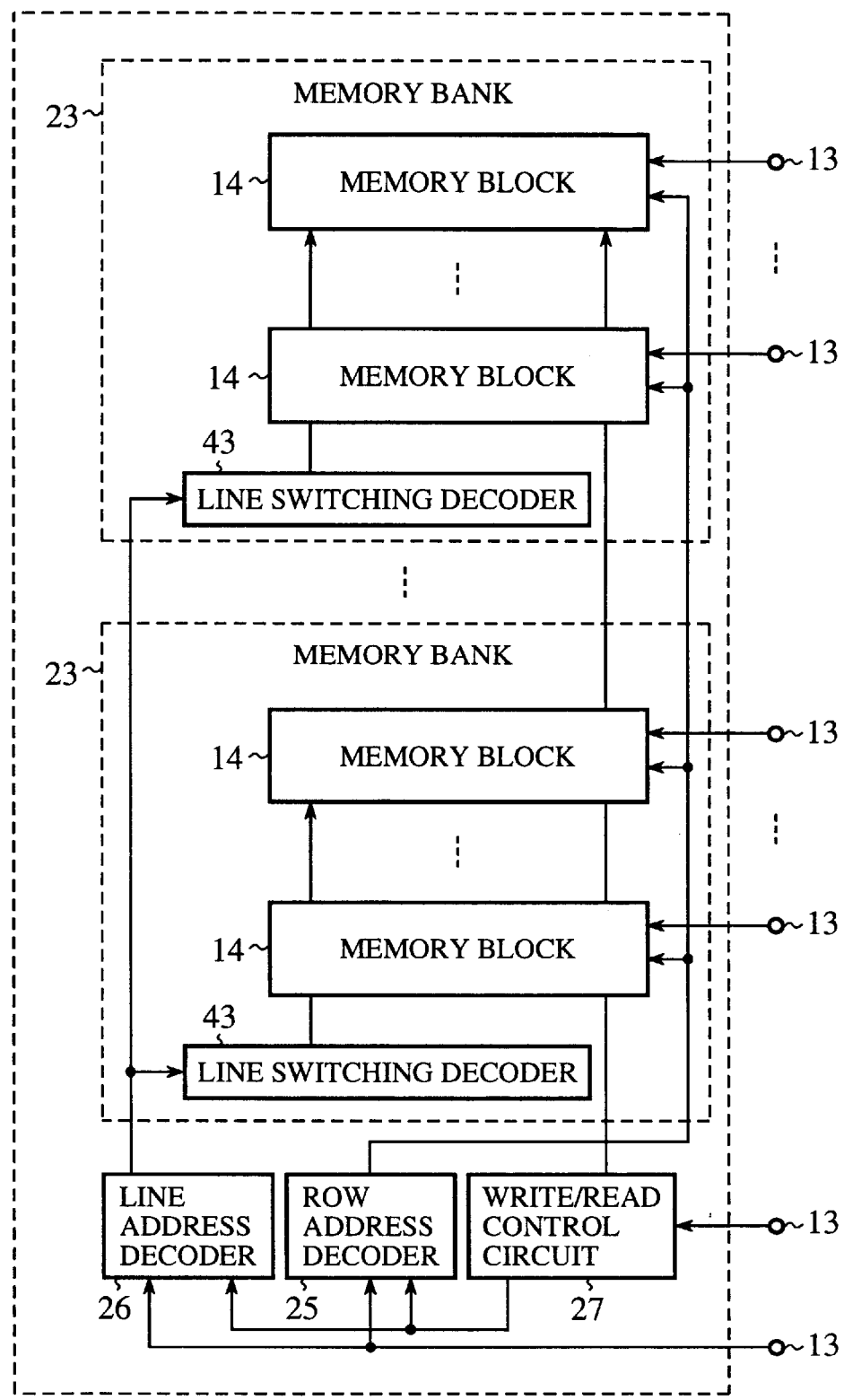
FIG. 5 is a block diagram showing the interior construction of an alteration of the semiconductor memory according to the embodiment 1 of the present invention.
Figure 6:
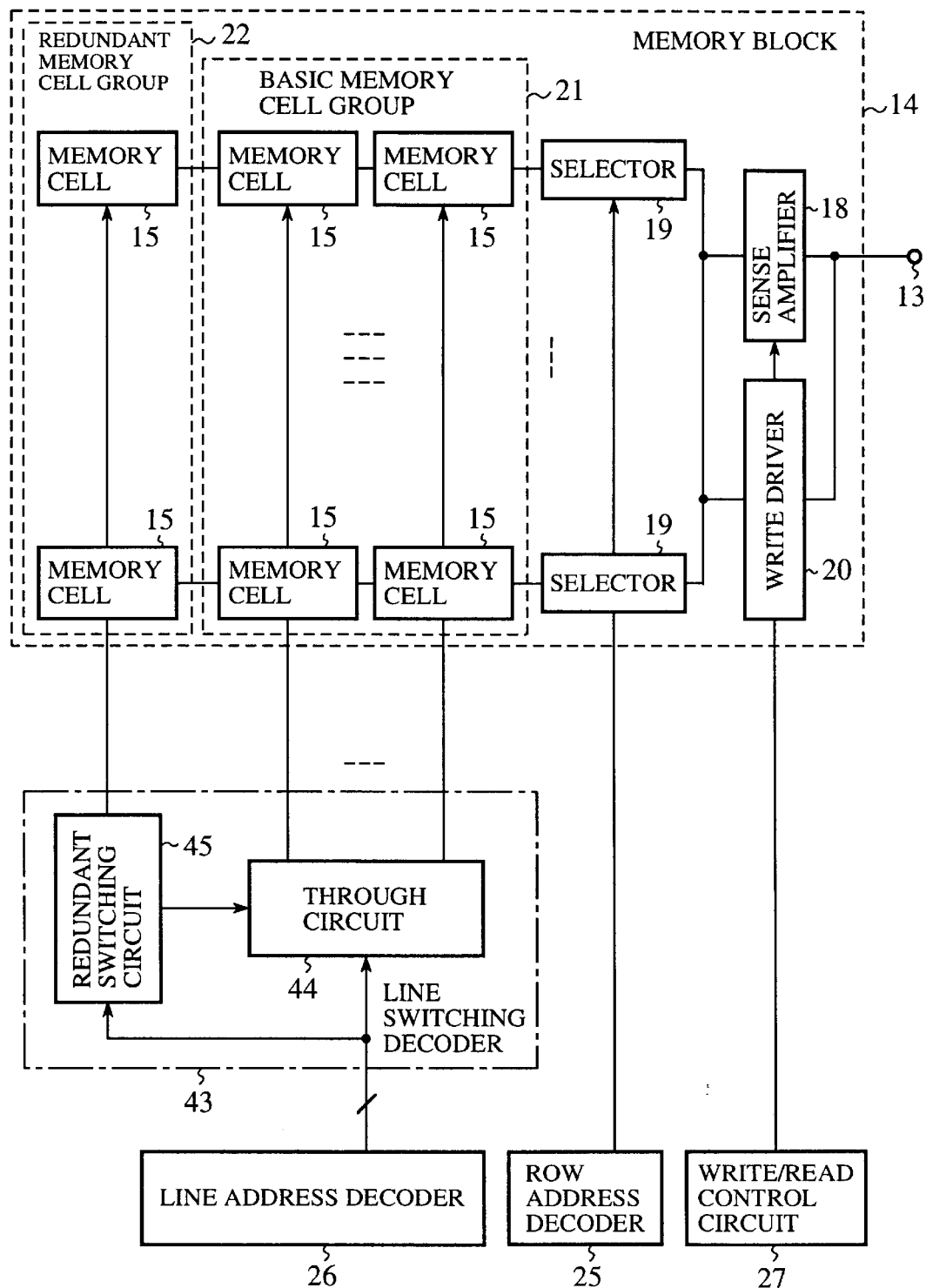
FIG. 6 is a block diagram showing the interior construction of an alteration of the memory test circuit according to the embodiment 1 of the present invention.

In the embodiment 1, the row switching decoders 24 are provided between the row address decoder 25 and the memory blocks 14 one for every internal data lines connected to each simultaneous write circuit 40 and each coincidence judgement circuit 41. However, as shown in FIGS. 5 and 6, switching decoders can be provided between the memory blocks 14 and the line address decoder 26 as line switching decoders 43. In addition, they may be provided one for every a number more or less than the number of internal data lines connected to each simultaneous write circuit 40 and each coincidence judgement circuit 41. In these figures, the reference number 43 designates a line switching decoder (switching decoder) provided one in each memory bank 23 for supplying a bit line selection voltage to a word line selected from a plurality of word lines 16 in each memory bank 23; 44 designates a through circuit for supplying a word line selection voltage from the line address decoder 26 as it is to any one of the word lines 16; and 45 designates a redundant switching circuit for stopping the through control of word line selection voltages by the through circuit 44 and at the same time supplying a word line selection voltage to a word line 16 of a redundant memory cell group 22 when a word line selection voltage for a particular preset word line 16 is detected and received.

As stated above, according to the embodiment 1, the integrated circuit 1 comprises; the semiconductor memory 2 for receiving m-bit internal data (m is an integer of 2 or more) in and outputting the data from an internal address; the logic circuit 3 for receiving the m-bit internal data from and outputting the data to the semiconductor memory 2 while designating the internal address; the internal data bus 4 connected between the semiconductor memory 2 and the logic circuit 3, having the m internal data lines, for transmitting the m-bit internal data between the semiconductor memory 2 and the logic circuit 3; the external data input/output terminal group 7 for receiving n-bit external data (n is less than m and an integer of 1 or more) from and outputting the data to the outside; the external data bus 8 connected between the logic circuit 3 and the external data input/output terminal group 7, having the n external data lines, for transmitting the n-bit external data between the logic circuit 3 and the external data input/output terminal group 7; the simultaneous write circuits 40, each connected to a plurality of internal data lines and an external data line, for receiving bit data which is at least a part of n-bit data in the external-data bus 8 from the external data line, dividing the data into a plurality of bit data of a same value, and outputting the divided data to the internal data lines, thereby the m-bit data being produced from the n-bit data in the external data bus and output to the internal data bus 4; and the coincidence judgement circuits 41, each connected to the same internal data lines and external data line as those which the corresponding simultaneous write circuit 40 is connected to, for effecting coincidence judgement of data in these internal data lines and outputting the coincidence judgement result to the external data line. Here, the number of the coincidence judgement circuits 41 is equal to that of the simultaneous write circuits 40. Thus, at the time of tests, the above construction allows the writing into the semiconductor memory 2 by utilizing all the bus width of a wide internal data bus 4 generally used in an integrated circuit, for example, with a semiconductor memory 2 of a large capacity.

Thus, even in such a logic-memory-combined integrated circuit 1, a semiconductor memory 2 of a large capacity can be efficiently tested for a short period of time corresponding to the degree of its large capacity by suitably using the basic structure of the existing integrated circuit 1, while suppressing or preventing the increased provision of external input/output terminals 7 for use in the tests.

According to the embodiment 1, the bit number "m" of internal data is "L" times the bit number "n" of external data wherein L is an integer of 2 or more; simultaneous write circuits 4 and coincidence judgement circuits 41 are provided one for every L internal data lines; and each coincidence judgement circuit 41 changes the level of an output to be provided to an external data line depending on coincidence/incoincidence. Thus, at the time of tests, the number of writing data to and reading data out of the semiconductor memory 2 can be 1/L; and both the advantage of suppressing the increased provision of external input/output terminals 7 for use in the tests and the advantage of enhancing the test efficiency can be simultaneously obtained by the maximum utilization of the basic structure of an existing logic-memory-combined integrated circuit 1.

Semiconductor memories used in such an invention includes a semiconductor memory 2 comprising: a plurality of memory blocks 14 each comprising; a plurality of memory cells 15 arranged in a matrix layout; a plurality of word lines 16 extending along one direction of the layout of the memory cells 15; a plurality of bit lines 17 extending along the other direction of the layout of the memory cells 15; a sense amplifier 18 connected to an internal data line; and a plurality of selectors 19 each connecting a bit line to the sense amplifier 18: a line address decoder 26 for applying a selection voltage to one of the word lines 16: and a row address decoder 25 for applying a selection voltage to one of the selectors 19.

Specially, according to the embodiment 1, there are provided the line switching decoders 43 or the row switching decoders 24 between the memory blocks 14 and the line address decoder 26 or the row address decoder 25, connected to word lines 16 or bit lines 17 of which the number is more than the line address decoder 26 or the row address decoder 25. Further, if the line address decoder 26 or the row address decoder 25 supplies a selection voltage for a certain word line 16 or bit line 17, a line switching decoder 43 or a row switching decoder 24 intercepts this voltage and supplies it to a line of the excess word lines 16 or bit lines 17. Consequently, the line switching decoders 43 or the row switching decoders 24 can prevent access to a memory cell 15 (word line 16, bit line 17) which has been found to be defective in a test and allows the use of a redundant word line 16 or bit line 17 which is excessively provided instead of the defective memory cell 15, efficiently enhancing the yield of an integrated circuit.

According to the embodiment 1, since the row switching decoders 24 are provided one for every internal data lines connected to each simultaneous write circuit 40 and each coincidence judgement circuit 41 between the memory blocks 14 and the row address decoder 25, test results can be one to one corresponded to the row switching decoders 24. Thus, only by setting an address where a defect is found by a test in the corresponding row switching decoder 24 such that a bit line 17 containing the address is replaced with a redundant bit line 17, the defect can be removed and each row switching decoder 24 is not required to perform a calculation for identifying a bit line 17 to be switched based on test results so that tests can be more efficiently performed.

Embodiment 2

Figure 7:
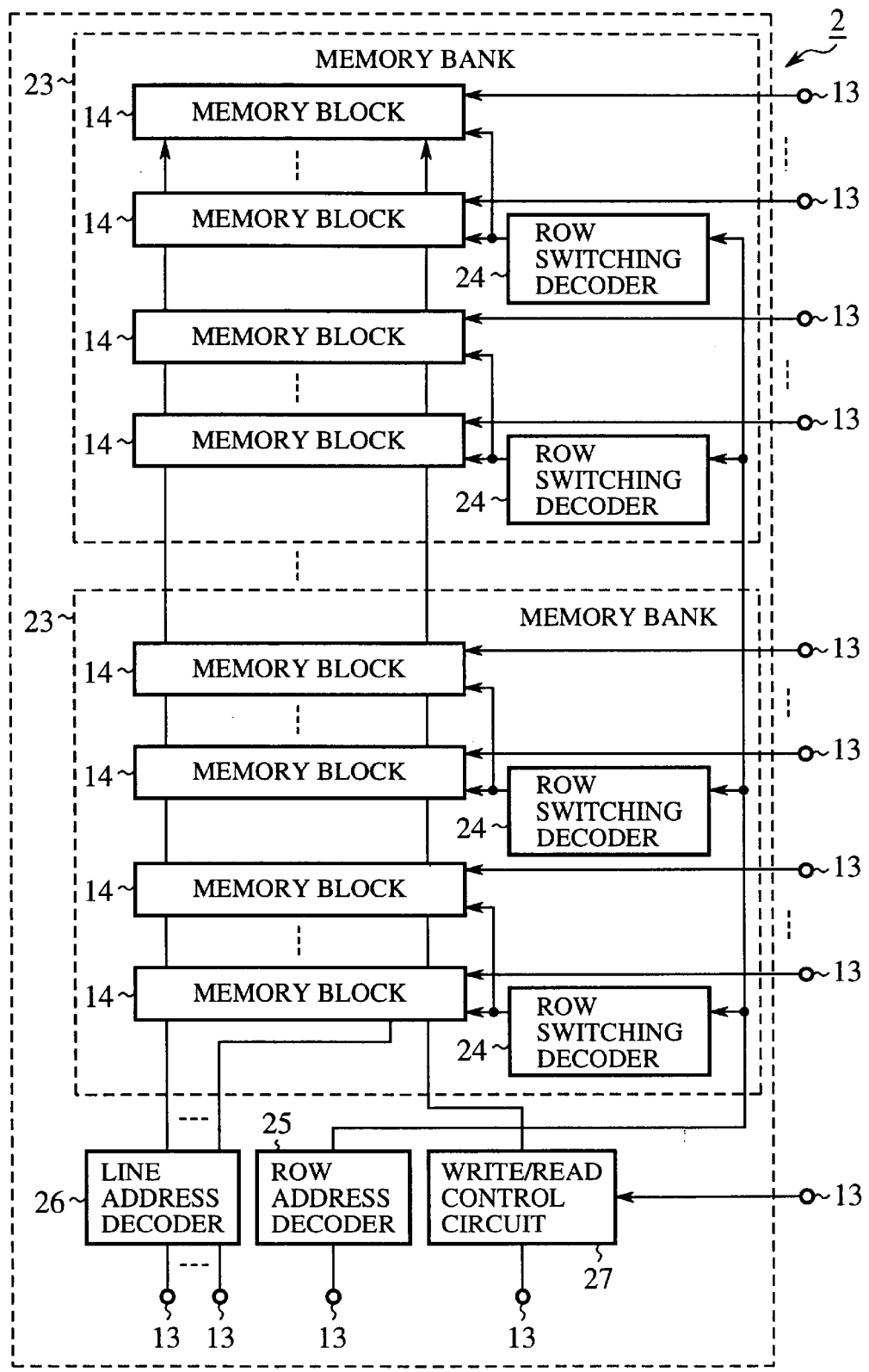
FIG. 7 is a block diagram showing the interior construction of a semiconductor memory according to the embodiment 2 of the present invention.

FIG. 7 is a block diagram showing the interior construction of a semiconductor memory 2 according to the embodiment 2 of the present invention. The semiconductor memory 2 is different from that shown in FIG. 2 only in row switching decoders 24 are provided two for each memory bank 23.

Figure 8:
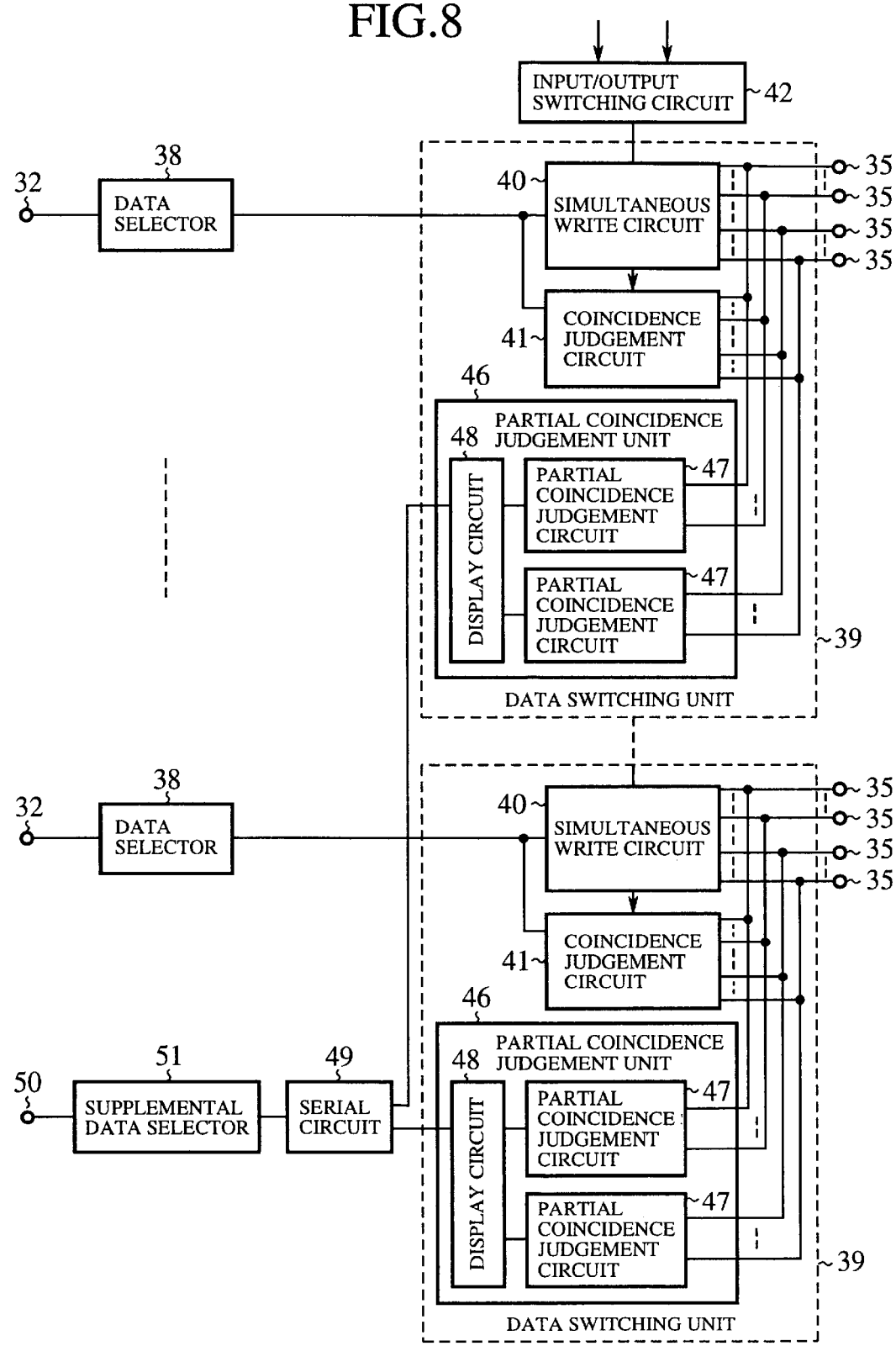
FIG. 8 is a block diagram showing the interior construction of a part of a memory test circuit according to the embodiment 2 of the present invention.

FIG. 8 is a block diagram showing the interior construction of a memory test circuit 12 (a part) according to the embodiment 2 of the present invention. In this figure, the reference numeral 46 designates a partial coincidence judgement unit (partial judgement means), provided one in each data switching unit 39, for effecting coincidence judgement of data per row switching decoder 24; 47 designates a partial coincidence judgement circuit, provided two in each partial coincidence judgement unit 46, for effecting coincidence judgement of data per row switching decoder 24; 48 designates a display circuit for receiving outputs from two partial coincidence judgement circuits 47 to provide outputs of different levels depending on which circuit 47 judges incoincidence; 49 designates a serial circuit (partial judgement means) for receiving signals of different levels from a plurality of display circuits 48 to switch them in sequence for serial output; 50 designates a supplemental data connection terminal connected to the serial circuit 49; and 51 designates a supplemental data selector, provided between the supplemental data connection terminal 50 and the serial circuit 49, for connecting therebetween in the test mode like data selectors 38. The other construction is the same as that of the embodiment 1 and the explanation thereof is omitted.

Next, the operation of this integrated circuit will be described.

If data is read out of each memory block 14 in the test mode set by a mode switching signal, each coincidence judgement circuit 41 judges for coincidence of internal data of L bits to output the result, and simultaneously each partial coincidence judgement circuit 47 also judges for coincidence of internal data of L/2 bits to output the result. Each display circuit 48 outputs a signal of different levels depending on which circuit 47 judges incoincidence and the serial circuit 49 then switches signals from a plurality of partial display circuits 48 in sequence to output them to the outside through the supplemental data connection terminal 50.

If a coincidence judgement circuit 41 outputs a judgement result of incoincidence, an operator confirms an output from the display circuit 48 in the same data switching unit 39 by an output level of the supplemental data connection terminal 50 and, thereby, can identify a row switching decoder 24 and memory blocks 14 connected to the decoder 24 where a malfunction has occurred. Accordingly, it can be easily identified a row switching decoder 24 to be switched only by confirming outputs of the coincidence judgement circuits 41 and an output of a display circuit 48. The other operation is the same as that of the embodiment 1 and the explanation thereof is omitted.

As stated above, according to the embodiment 2, there are provided the row switching decoders 24 provided one for each L/2 internal data lines between the row address decoder 25 and the memory blocks 14; the partial coincidence judgement circuits 47 provided two for each coincidence judgement circuit 41, half of L internal data lines connected to a coincidence judgement circuit 41 being connected a partial coincidence judgement circuit 47, for effecting coincidence judgement for the L/2 internal data lines; and the partial coincidence judgement units 46 for outputting different signals depending on which circuit 47 judges incoincidence. Consequently, in a case where a test result from an external data connection terminal 32 shows malfunction, if an output signal from the corresponding partial coincidence judgement unit 46 is confirmed, a row switching decoder 24 connected to a fault bit line can be identified.

Accordingly, the bus width of the internal data bus 4 can be determined regardless of the number of the row switching decoders. Further, although all the internal data lines associated with the plurality of row switching decoders 24 are judged together by the coincidence judgement circuits 41, a row switching decoder 24 connected to the defective bit line can be simultaneously confirmed. Only the row switching decoder 24 is required to switch the defective bit line. Thus, defects can be removed by the maximum utilization of the basic structure of an existing logic-memory-combined integrated circuit 1, thereby enhancing its yield.

Further, since an output of a coincidence judgement circuit 41 is first confirmed, in case of coincidence in this first step, outputs of partial coincidence judgement circuits 47 is not required to be confirmed, thus improving the test efficiency.

According to the embodiment 2, since a partial coincidence judgement unit 46 has a display circuit 48 for receiving outputs from two partial coincidence judgement circuits 47 and outputting signals of different levels depending on which circuit 47 judges incoincidence, the number of external input/output terminals 7 required to confirm outputs from partial coincidence judgement circuits 47 from the outside can be reduced by half. Thus, both the advantage of suppressing the increased provision of external input/output terminals 7 for use in the tests and the advantage of enhancing the test efficiency can be simultaneously obtained with a higher yield by increasing row switching decoders 24.

According to the embodiment 2, since there is provided a serial circuit 49 for switching outputs from the plurality of display circuits 48 in sequence to serially output them to the outside, the number of external input/output terminals 7 required to confirm outputs of the display circuits 48 from the outside can be reduced to the inverse number of its switching number (in the embodiment 2, the inverse number is 1/L). Thus, both the advantage of suppressing the increased provision of external input/output terminals 7 for use in the tests and the advantage of enhancing the test efficiency can be simultaneously obtained with a higher yield by increasing row switching decoders.

Specially, the display circuits 48 and the serial circuit 49 allows an effective decrease in number of external input/output terminals 7 without loss of any necessary information because the display circuit 48 first executes its processing. Thus, even if the capacity of a semiconductor memory in a logic-memory-combined integrated circuit will become further larger in future, the increased provision of external input/output terminals 7 for use in tests can be effectively suppressed, while enhancing the test efficiency.

Figure 9:
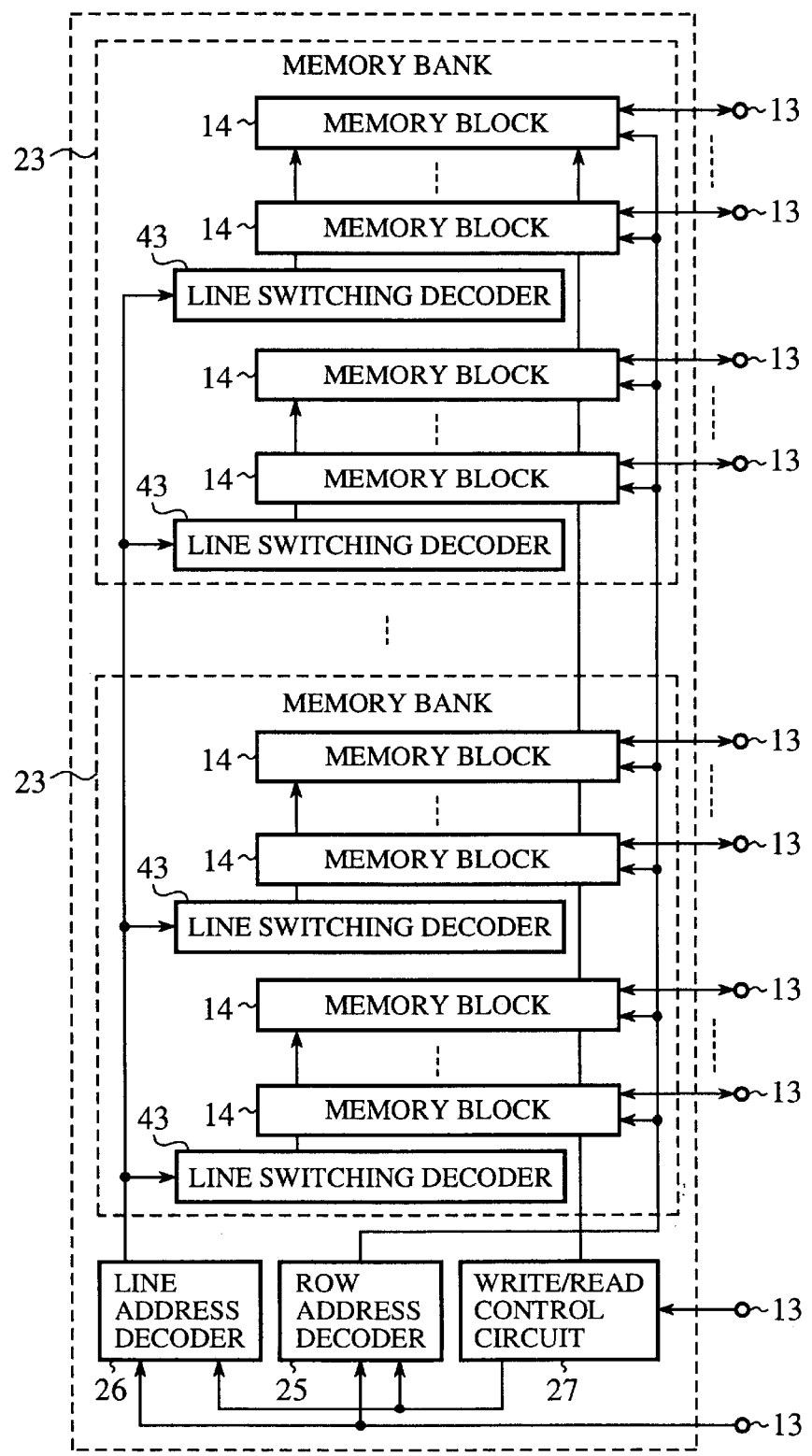
FIG. 9 is a block diagram showing the interior construction of an alteration of the semiconductor memory according to the embodiment 2 of the present invention.

Further, as shown in FIG. 9, in a case where a plurality (two) of line switching decoders 43 are provided in a memory bank 23, the same advantages can be obtained by the provision of partial coincidence judgement circuits 47 corresponding to the number of the line switching decoders 43.

Embodiment 3

Figure 10:
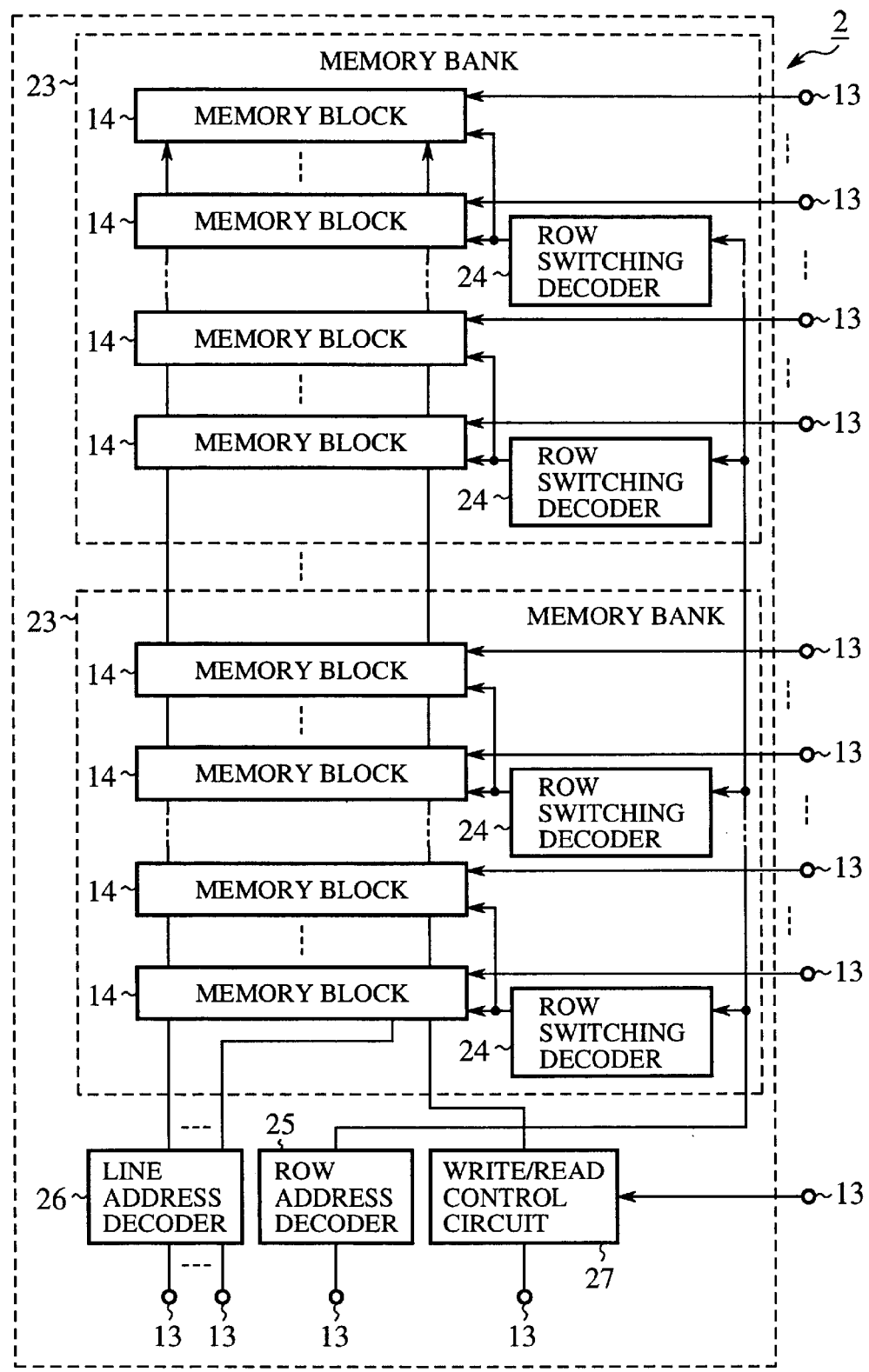
FIG. 10 is a block diagram showing the interior construction of a semiconductor memory according to the embodiment 3 of the present invention.

FIG. 10 is a block diagram showing the interior construction of a semiconductor memory 2 according to the embodiment 3 of the present invention. The semiconductor memory 2 is different from that shown in FIG. 7 only in row switching decoders 24 are provided the number j for each memory bank 23 wherein j is an integer of 2 or more.

Figure 11:
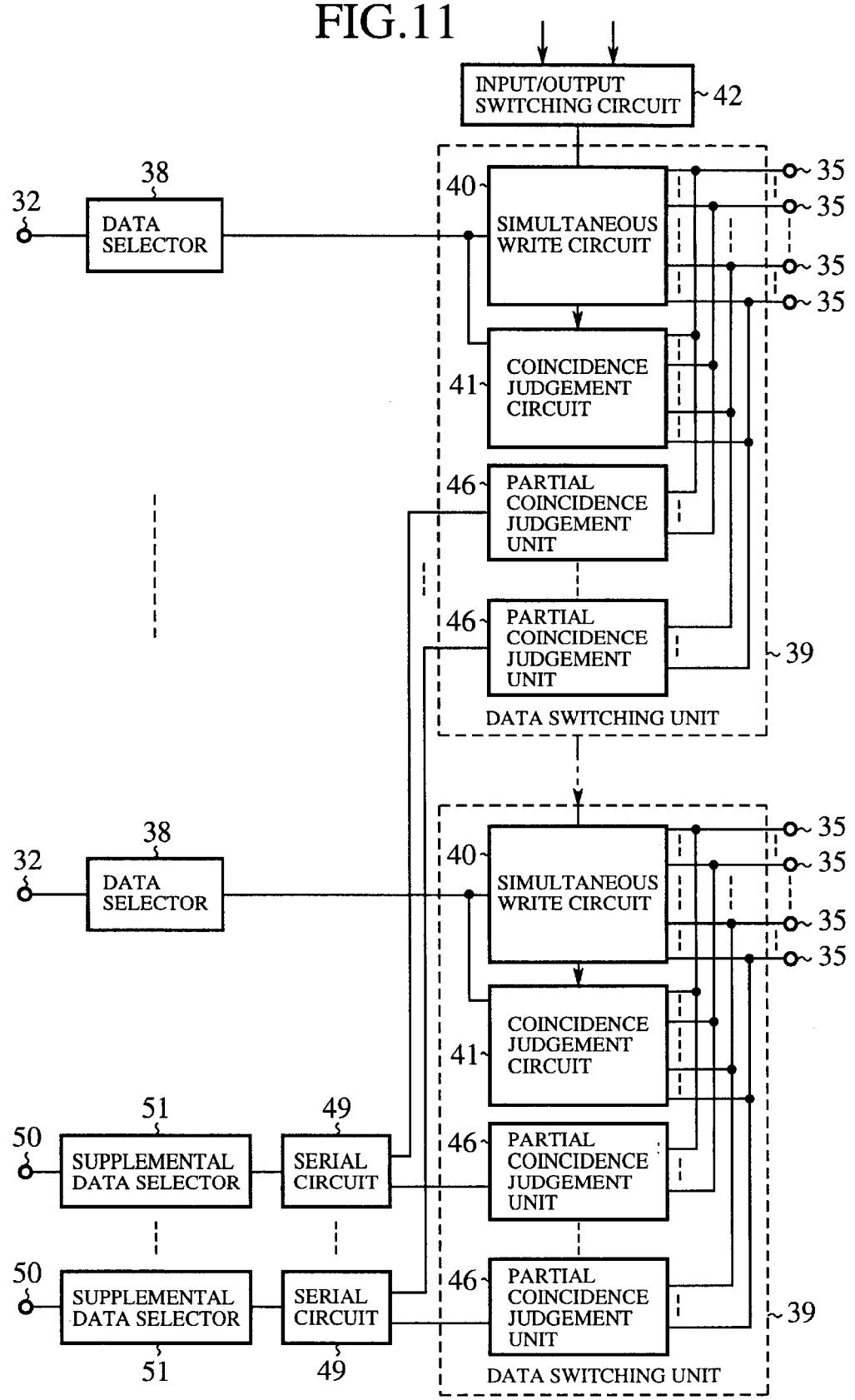
FIG. 11 is a block diagram showing the interior construction of a part of a memory test circuit according to the embodiment 3 of the present invention.

FIG. 11 is a block diagram showing the interior construction of a memory test circuit 12 (a part) according to the embodiment 3 of the present invention. The memory test circuit 11 is different from that shown in FIG. 8 only in partial coincidence judgement circuits 46 are provided the number j for each data switching unit 39. The other construction is the same as that of the embodiment 2 and the explanation thereof is omitted.

Next, the operation of this integrated circuit will be described.

If data is read out of each memory block 14 in the test mode set by a mode switching signal, each coincidence judgement circuit 41 judges for coincidence of internal data of L bits to output the result, and simultaneously each partial coincidence judgement circuit 47 also judges for coincidence of internal data of L/j bits to output the result. Each display circuit 48 outputs a signal of different levels depending on which circuit 47 judges incoincidence and the serial circuit 49 then switches signals from a plurality of partial display circuits 48 in sequence to output them to the outside through the supplemental data connection terminal 50.

If a coincidence judgement circuit 41 outputs a judgement result of incoincidence, an operator confirms an output from the display circuit 48 in the same data switching unit 39 by an output level of the supplemental data connection terminal 50 and, thereby, can identify a row switching decoder 24 and memory blocks 14 connected to the decoder 24 where a malfunction has occurred. Accordingly, it can be easily identified a row switching decoder 24 to be switched only by confirming outputs of the coincidence judgement circuits 41 and an output of a display circuit 48. The other operation is the same as that of the embodiment 1 and the explanation thereof is omitted.

As stated above, since the number of the row switching decoders 24 is equal to that of the partial coincidence judgement circuits 47, the same advantages as those of the embodiment 2 can be obtained.

Figure 12:
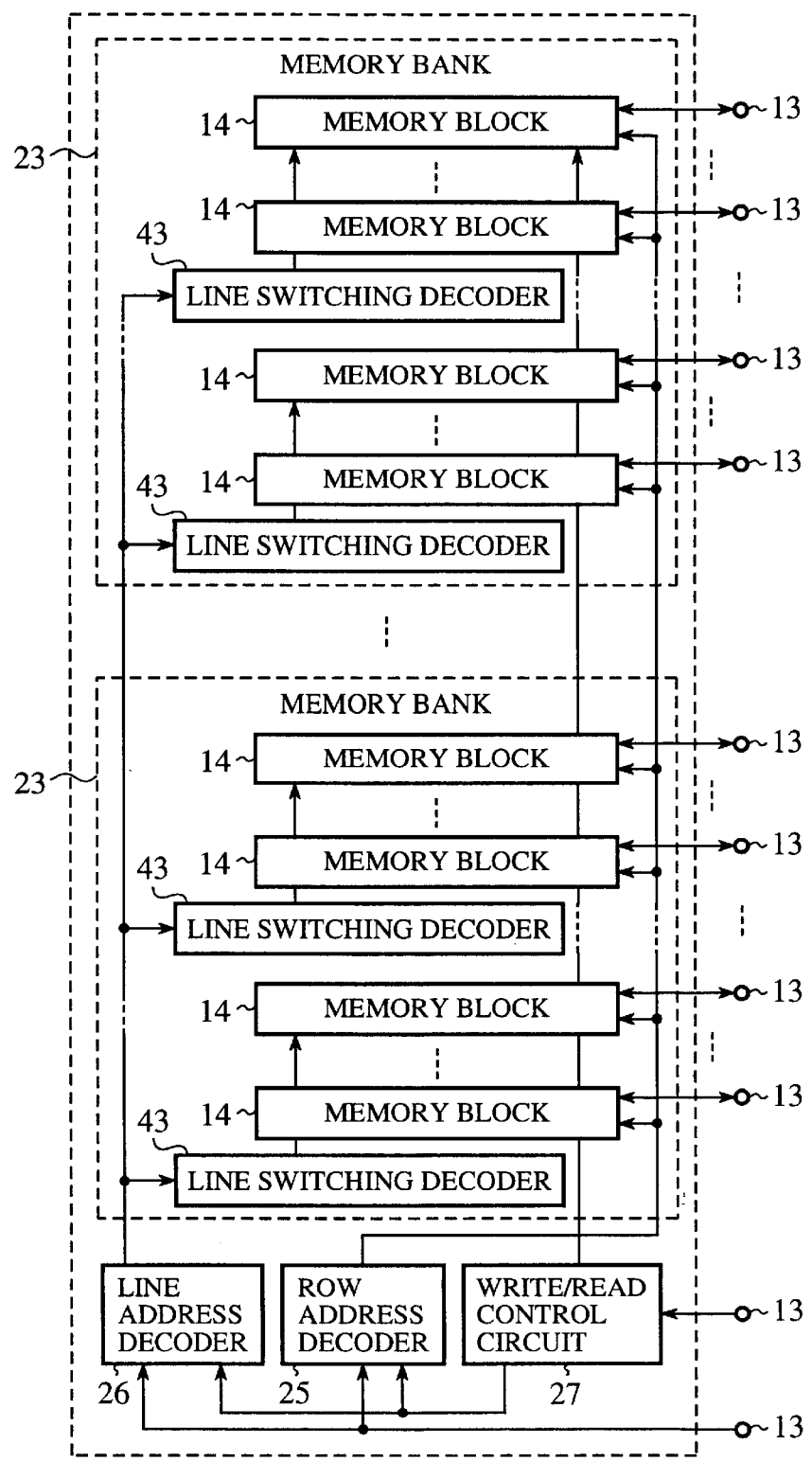
FIG. 12 is a block diagram showing the interior construction of an alteration of the semiconductor memory according to the embodiment 3 of the present invention.

Further, as shown in FIG. 12, in a case where a plurality of line switching decoders 43 are provided in a memory bank 23, the same advantages can be obtained by the provision of partial coincidence judgement circuits 47 corresponding to the number of the line switching decoders 43.

Embodiment 4

Figure 13:
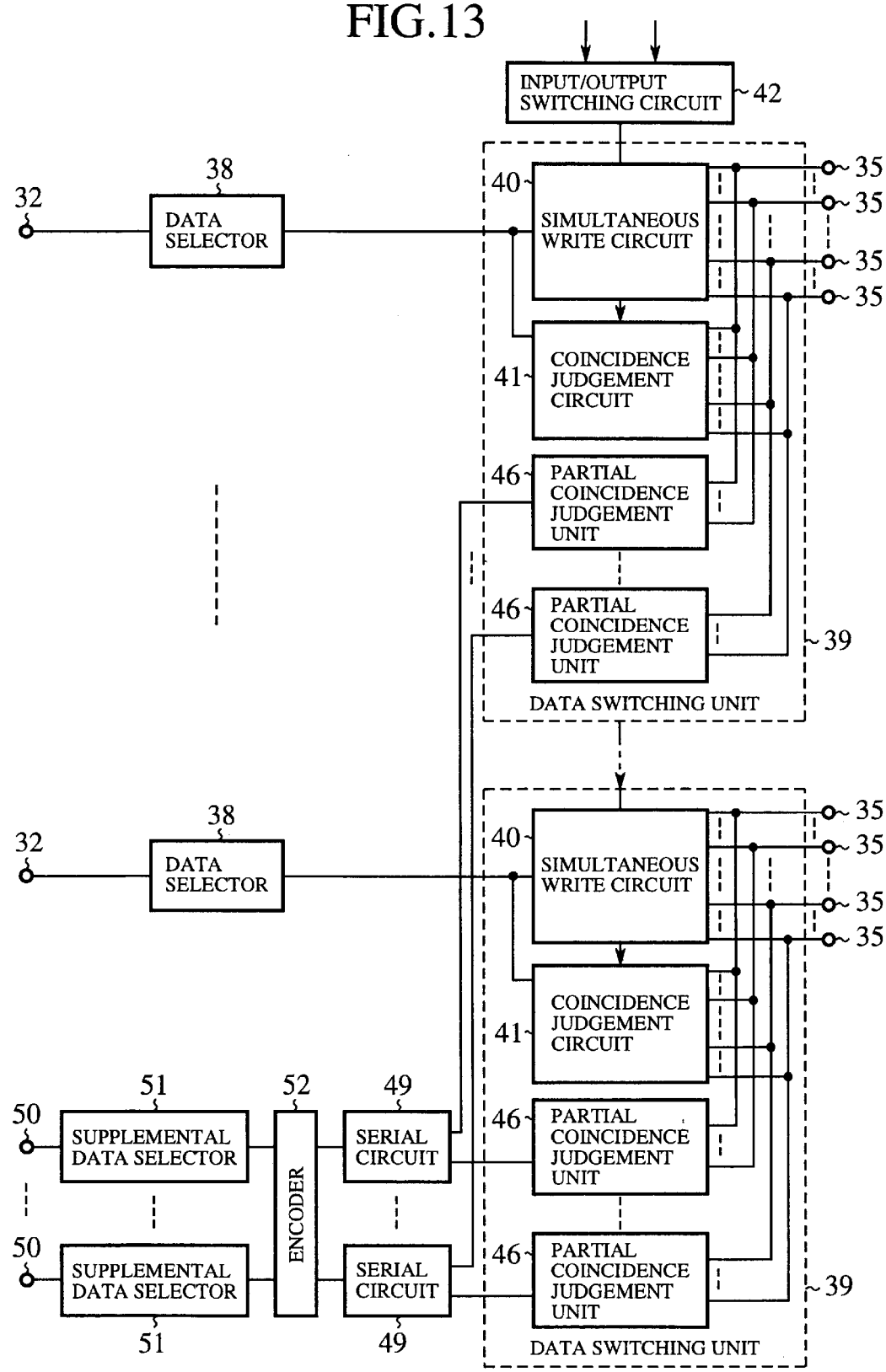
FIG. 13 is a block diagram showing the interior construction of a part of a memory test circuit according to the embodiment 4 of the present invention.
Figure 14:
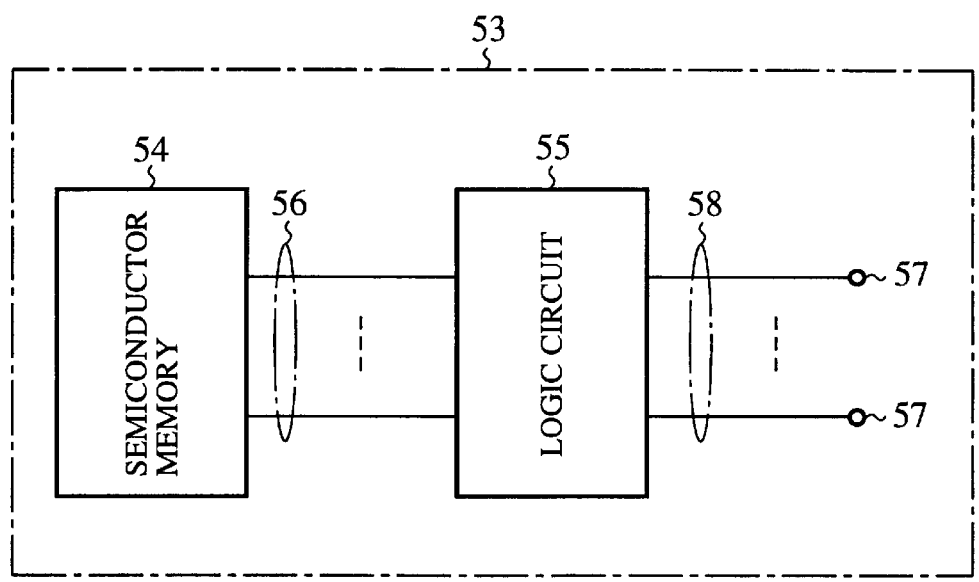
FIG. 14 is a block diagram showing a conventional integrated circuit.

FIG. 13 is a block diagram showing the interior construction of a memory test circuit 12 (a part) according to the embodiment 4 of the present invention. In this figure, the reference numeral 52 designates an encoder (partial judgement means), provided between a plurality of serial circuits 49 and a plurality of supplemental data selectors 51, for generating a signal of bits less than the bits of signals input from the serial circuits 49. The other construction is the same as that of the embodiment 3 and the explanation thereof is omitted.

Next, the operation of this integrated circuit will be described.

If a plurality of level signals are simultaneously output from the serial circuits 49, the encoder 52 encodes them to generate signals of bits less than those of the input signals and output data of bits less than the number of the serial circuits 49 to the outside through the supplemental connection terminals 50. The other operation is the same as that of the embodiment 3 and the explanation thereof is omitted.

As stated above, according to the embodiment 4, since there is provided the encoder 52 for encoding outputs from the serial circuits 49 to convert them to signals of bits less than the bits thereof, the number of the external input/output terminals 7 required to confirm outputs of partial coincidence judgement circuits 47 from the outside can be reduced. Thus, both the advantage of suppressing the increased provision of external input/output terminals 7 for use in the tests and the advantage of enhancing the test efficiency can be simultaneously obtained with a higher yield by increasing row switching decoders 24.

In particular, since display circuits 48, the serial circuits 49 and the encoder 52 are arranged in this order, even if the capacity of a semiconductor memory 2 in a logic-memory-combined integrated circuit 1 undergoes further increases in the future, the test efficiency can be enhanced, while the number of the external input/output terminals 7 for use in tests is effectively suppressed.

Last, although all the embodiments have been described referring to cases where the redundant memory cell group 22 contains only one row (one line) of memory cells 15, even in cases where the redundant memory cell group 22 contains a plurality of rows (lines) of memory cells 15, the same advantages can be obtained. Further, although all the embodiments have been described referring to cases where outputs of all the partial coincidence judgement units 46 is connected to one terminal 7, even in cases where they are divided and connected to a plurality of terminals 7, the same advantages can be obtained. Further, although all the embodiments have been described referring to cases where the mode is switched by a signal input to the external mode control terminal 11, even in cases where it can be switched by changing a supplied voltage into a certain power source terminal (for example, a higher voltage than that of the power source is applied to the terminal), the same advantages can be obtained. Since the external mode control terminal 11 is necessary for tests of a semiconductor memory chip with integrated circuits formed thereon, it is not required to be connected to an external lead and the like at the time of packaging.

What is claimed is:

1. An integrated circuit comprising;
   a semiconductor memory for receiving therein m-bit internal data (m is an integer of 2 or more) and outputting the data from an internal address;
   a logic circuit for receiving the m-bit internal data and outputting the data to the semiconductor memory while designating the internal address;
   an internal data bus connected between the semiconductor memory and the logic circuit, having m internal data lines, for transmitting the m-bit internal data between the semiconductor memory and the logic circuit;
   a data input/output terminal group for receiving n-bit external data (n is less than m and an integer of 1 or more) and outputting the data to the outside;
   an external data bus connected between the logic circuit and the data input/output terminal group, having n external data lines, for transmitting the n-bit external data between the logic circuit and the data input/output terminal group; and
   a data switching unit for connecting the external data line to a plurality of the internal data lines when a mode is switched from a normal mode to a test mode;
   wherein the data switching unit includes at least one simultaneous write circuit, each connected to a plurality of internal data lines and an external data line, for receiving from the external data lines bit data which is at least a part of n-bit data on the external data bus from the external data line, dividing the data into a plurality of bit data of a same value, and simultaneously outputting the divided data to the internal data lines; and
   at least one coincidence judgement circuit of the same number as that of the simultaneous write circuit(s), each connected to same internal data lines and external data line as the simultaneous write circuit, for effecting coincidence judgement of data out of the simultaneous write circuit on these internal data lines and outputting a coincidence judgement result to the external data line.

2. An integrated circuit according to claim 1, wherein the coincidence judgment circuit supplies a signal of a high level when outputs from the plurality of internal data lines coincide with each other, and supplies a signal of low level when at least one of the outputs from the plurality of internal data lines do not coincide with the other data lines.

3. An integrated circuit according to claim 1, wherein the semiconductor memory comprises
   a first memory block each comprising a plurality of memory cells arranged in a form of a matrix; a plurality of word lines extending along one direction of the layout of the memory cells; a plurality of bit lines extending along another direction of the layout of the memory cells; a sense amplifier connected to an internal data line; and a selector connecting a bit line to the sense amplifier;
   a second memory block each comprising a plurality of memory cells arranged in the form of a matrix; a plurality of word lines extending along one direction of the layout of the memory cells; a plurality of bit lines extending along another direction of the layout of the memory cells; a sense amplifier connected to the internal data line; and a plurality of selectors each connecting a bit line to the sense amplifier;
   a line address decoder for applying a selection voltage to one of the word lines; and
   a row address decoder for applying a selection voltage to one of the selectors.

4. An integrated circuit according to claim 3, further comprising a line switching decoder provided between the memory block and the line address decoder, for outputting a selection voltage applied from the line address decoder to one of the particular word line and selecting a memory element connected to the word line when a predetermined selection voltage is output from the line address decoder to a particular word line; and
   a row switching decoder provided between the row address decoder and the memory blocks, for outputting a selection voltage applied from the row address decoder to a particular preset bit line and selecting a memory element connected to the bit line when a selection voltage is output from the line address decoder to a particular present bit line.

5. An integrated circuit according to claim 4, wherein the line switching decoder or the row switching decoder comprises a redundant switching circuit for outputting a bit line selection voltage to a selector connected to a bit line of the plurality of memory elements so as to utilize a memory element in the first memory block in place of the defective memory element when the memory element in the second memory block has determined to be defective.

6. An integrated circuit according to claim 4, wherein wherein j (j is an integer of 2 or more) row switching decoder are provided.

7. An integrated circuit comprising:
   a semiconductor memory for receiving therein m-bit internal data (m is an integer of 2 or more) and outputting the data from an internal address;
   a logic circuit for receiving the m-bit internal data and outputting the data to the semiconductor memory while designating the internal address;

an internal data bus connected between the semiconductor memory and the logic circuit, having m internal data lines, for transmitting the m-bit internal data between the semiconductor memory and the logic circuit;

a data input/output terminal group for receiving n-bit external data (n is less than m and an integer of 1 of more) and outputting the data to the outside;

an external data bus connected between the logic circuit and the data input/output group, having n external data lines, for transmitting the n-bit external data between the logic circuit and the data input/output terminal group; and a data switching unit for connecting the external data line to a plurality of the internal data lines when a mode is switched from the normal mode to a test mode;

wherein the data switching unit comprises at least one simultaneous write circuit, each connected to the plurality of internal data lines and the external data line, for receiving from the external data lines bit data which is at least a part of n-bit data on the external data bus, dividing the data into a plurality of bit data of the same value, and simultaneously outputting the divided data to the internal data lines; and at least one coincidence judgement circuit of the same number as that of the simultaneous write circuit(s), each connected to the same internal data lines and external data line as the simultaneous write circuit, for effecting coincidence judgement of data out from the simultaneous write circuit on these internal data lines and outputting a coincidence judgement result to the external data line; and partial coincidence judgement means for effecting coincidence judgement data per each switching decoder.

8. An integrated circuit according to claim 7, wherein the partial coincidence judgement means comprises a plurality of partial coincidence judgement circuits for effecting coincidence judgement of data per each switching decoder; and a display circuit for receiving outputs from the plurality of partial coincidence judgement circuits and outputting signals of different levels depending on which circuit determines incoincidence.

9. An integrated circuit according to claim 7, further comprising an encoder for receiving a plurality of outputs from the partial coincidence judgement circuits, and generating a signal of bits less than the bits of signals received from the partial coincidence judgement circuits.

* * * * *